United States Patent
Chu et al.

(10) Patent No.: US 10,658,479 B2
(45) Date of Patent: May 19, 2020

(54) FLASH MEMORY CELL STRUCTURE WITH STEP-SHAPED FLOATING GATE

(71) Applicant: Taiwan Semiconductor Manufacturing Co., Ltd., Hsinchu (TW)

(72) Inventors: Yu-Hsien Chu, Kaohsiung (TW); Chiang-Ming Chuang, Changhua (TW); Cheng-Huan Chung, Pingtung County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/191,085

(22) Filed: Nov. 14, 2018

(65) Prior Publication Data

US 2019/0148504 A1    May 16, 2019

Related U.S. Application Data (60) Provisional application No. 62/586,316, filed on Nov. 15, 2017.

(51) Int. Cl.
*H01L 29/423* (2006.01)
*H01L 27/11521* (2017.01)
(Continued)

(52) U.S. Cl.
CPC .. *H01L 29/42328* (2013.01); *H01L 21/32115* (2013.01); *H01L 21/32139* (2013.01);
(Continued)

(58) Field of Classification Search
CPC ......... H01L 29/42324; H01L 29/42328; H01L 29/66825; H01L 29/788; H01L 27/11517;
(Continued)

(56) References Cited

U.S. PATENT DOCUMENTS 7,157,762 B2 *  1/2007  Lee ..................... H01L 27/105
                                                          257/296
8,785,307 B2    7/2014  Liu et al.
(Continued)

FOREIGN PATENT DOCUMENTS

TW      200828597 A      7/2008
TW      201409618 A      3/2014
TW      201503292 A      1/2015

OTHER PUBLICATIONS

Office Action, dated Dec. 26, 2019, for Taiwan Intellectual Property Office Patent Appl. No. 107140571, 4 pages.

*Primary Examiner* — Hsien Ming Lee
(74) *Attorney, Agent, or Firm* — Sterne, Kessler, Goldstein & Fox P.L.L.C.

(57) ABSTRACT

The present disclosure relates to a flash memory cell that includes a substrate and a floating gate structure over the substrate. The floating gate structure includes a first portion having a first top surface and a first thickness. The floating gate structure also includes a second portion having a second top surface and a second thickness that is different from the first thickness. The floating gate structure further includes a sidewall surface connecting the first and second top surfaces, and an angle between the first top surface and the sidewall surface of the floating gate structure is an obtuse angle. The flash memory cell also includes a control gate structure over the first and second portions of the floating gate structure.

20 Claims, 7 Drawing Sheets

(51) Int. Cl.
*H01L 21/321* (2006.01)
*H01L 29/66* (2006.01)
*H01L 21/3213* (2006.01)
*H01L 21/28* (2006.01)
*H01L 29/788* (2006.01)
*H01L 27/11534* (2017.01)
*H01L 27/11524* (2017.01)

(52) U.S. Cl.
CPC .. *H01L 27/11521* (2013.01); *H01L 27/11524* (2013.01); *H01L 27/11534* (2013.01); *H01L 29/40114* (2019.08); *H01L 29/42324* (2013.01); *H01L 29/66825* (2013.01); *H01L 29/7881* (2013.01)

(58) Field of Classification Search
CPC ........ H01L 2924/1438; G11C 16/0408; G11C 2216/06
See application file for complete search history.

(56) References Cited

U.S. PATENT DOCUMENTS 9,293,204 B2  3/2016  Do et al.
9,825,046 B2  11/2017  Lin et al.

\* cited by examiner

FLASH MEMORY CELL STRUCTURE WITH STEP-SHAPED FLOATING GATE

This application claims the benefit of U.S. Provisional Patent Application No. 62/586,316, titled "Flash Memory Cell Structure with Step-shaped Floating Gate (FG) and Method for Forming the Same," which was filed on Nov. 15, 2017 and is incorporated herein by reference in its entirety.

BACKGROUND

Nonvolatile memory is often used in various devices, such as computers. Nonvolatile memory is a type of memory storage that can retain data even while it is not powered on. Examples of nonvolatile memory include flash memory, electrically programmable read-only memory (EPROM), and electrically erasable programmable read-only memory (EEPROM). Functionality of nonvolatile memory includes programming, read, and erase operations.

Each of the nonvolatile memory units can be formed as a field-effect transistor, including a floating gate and a control gate. The floating gate can be configured to hold charge and is fabricated on an oxide layer over an active region of a semiconductor substrate. The floating gate can be separated from source/drain regions in the semiconductor substrate by the oxide layer.

BRIEF DESCRIPTION OF THE DRAWINGS

Aspects of the present disclosure are best understood from the following detailed description when read with the accompanying figures. In accordance with the common practice in the industry, various features are not drawn to scale. In fact, the dimensions of the various features may be arbitrarily increased or reduced for clarity of illustration and discussion.

FIGS. 3A-8 are cross-sectional views of exemplary flash memory devices with enhanced coupling ratio and various data retention/erase capabilities, in accordance with some embodiments.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in contact (e.g., in direct or physical contact), and may also include embodiments in which additional features are disposed between the first and second features, such that the first and second features are not in contact (e.g., in direct or physical contact). In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially, relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances.

The term "substantially" as used herein indicates the value of a given quantity that can vary based on a particular technology node associated with the subject semiconductor device. In some embodiments, based on the particular technology node, the term "substantially" can indicate a value of a given quantity that varies within, for example, ±5% of a target (or intended) value.

The term "about" as used herein indicates the value of a given quantity that can vary based on a particular technology node associated with the subject semiconductor device. In some embodiments, based on the particular technology node, the term "about" can indicate a value of a given quantity that varies within, for example, 10-30% of the value (e.g., ±10%, ±20%, or ±30% of the value).

Power consumption of a flash memory device has become an important issue as portable electronic devices have become increasingly popular. A flash memory device includes a memory array with a number of memory units (e.g., memory cells). Each memory units can be formed using a field-effect transistor, including a floating gate and a control gate. The floating gate can be configured to hold charge and fabricated on an oxide layer over an active region of a semiconductor substrate. The floating gate can be separated from source/drain regions in the semiconductor substrate by the oxide layer. During a program (or write) operation, each memory cell can be electrically charged by injecting electrons into the floating gate from the substrate through the oxide layer. During an erase operation, charge can be removed from the floating gate. Data in each of the memory cells can be determined by the charge accumulated in the floating gate.

Various embodiments in accordance with this disclosure describe structures and methods of enhancing a coupling ratio in flash memory cells and fabricating flash memory cells with different erase and retention performance. In some embodiments, non-vertical step-shaped floating gate structures include step-shaped floating gate structures with non-vertical sidewalls formed between the floating gate and control gate of the flash memory cell. In some embodiments, flash memory cells on the same chip can include non-vertical step-shaped floating gate structures with different outer sidewall thicknesses. For example, a lower outer sidewall height of the floating gate structure decreases contact surface between the floating gate and erase gate which in turn improves the data retention capability of the flash memory cell. On the other hand, a greater outer sidewall height of the floating gate structure increases the contact surface between the floating gate and erase gate which in turn improves the erase capability of the flash memory cell.

In accordance with various embodiments of this disclosure, non-vertical step-shaped floating gate structures provide, among other things, benefits such as (i) enhanced coupling ratio by increasing the capacitance between the floating gate and the control gate as the top surface area of the floating gate is increased due to the step-shaped floating gate structures; (ii) further enhanced coupling ratio by further increasing the top surface area of the floating gate due to non-vertical sidewalk of the step-shaped structures; (iii) reduced programming voltage supply while maintaining flash memory cell performance due to an enhanced coupling ratio; (iv) enhancing the uniformity and conformality of the inter-gate dielectric layer due to non-vertical sidewalls of the step-shaped structure; and (v) forming flash memory cells with different retention and erase performance (e.g., on the same chip) due to different outer sidewall thicknesses of the non-vertical step-shaped floating gate structures.

Figure 1:
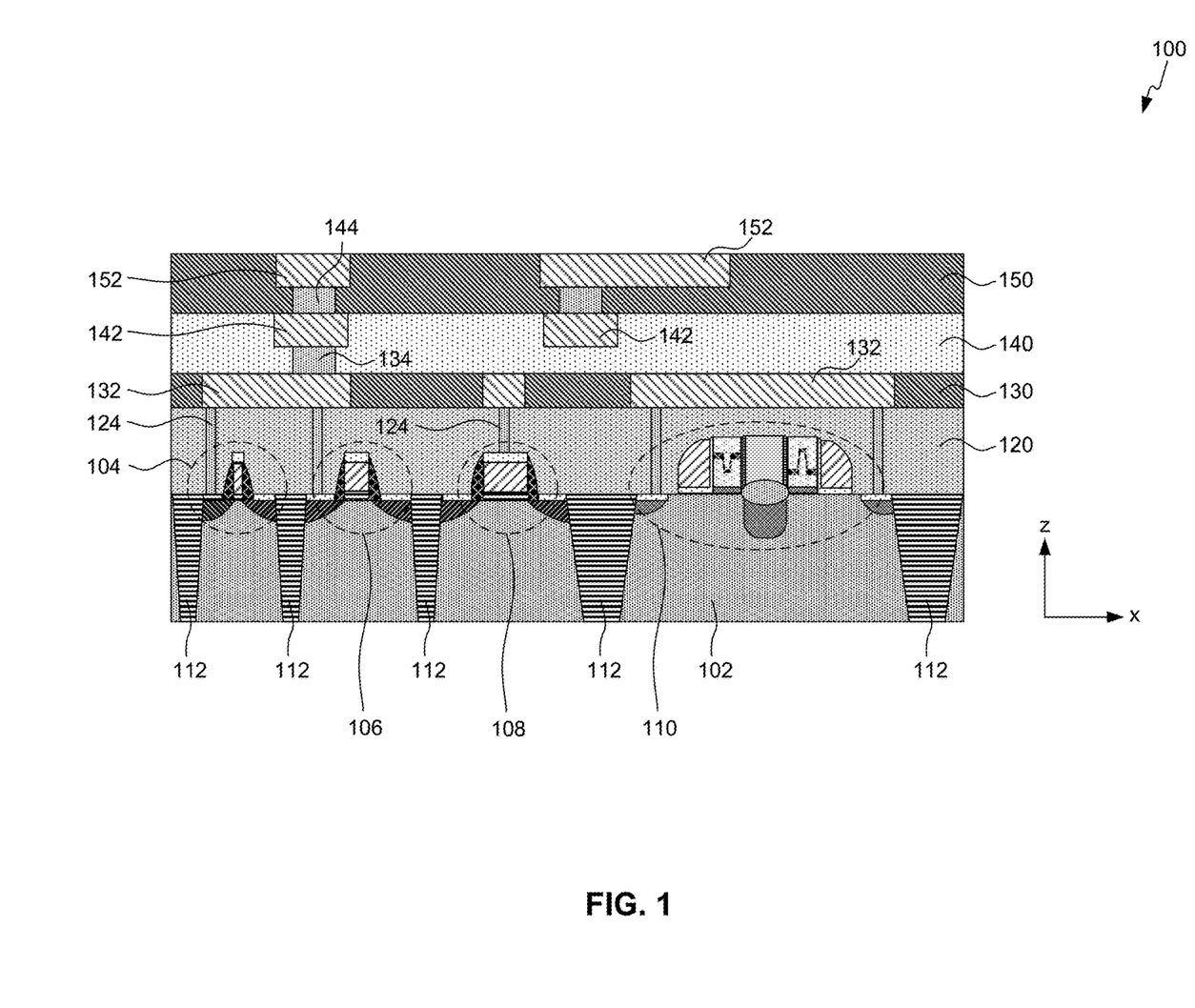
FIGS. 1-2 are cross-sectional views of flash memory devices with step-shaped floating gates having non-vertical sidewalls, in accordance with some embodiments.
Figure 2:
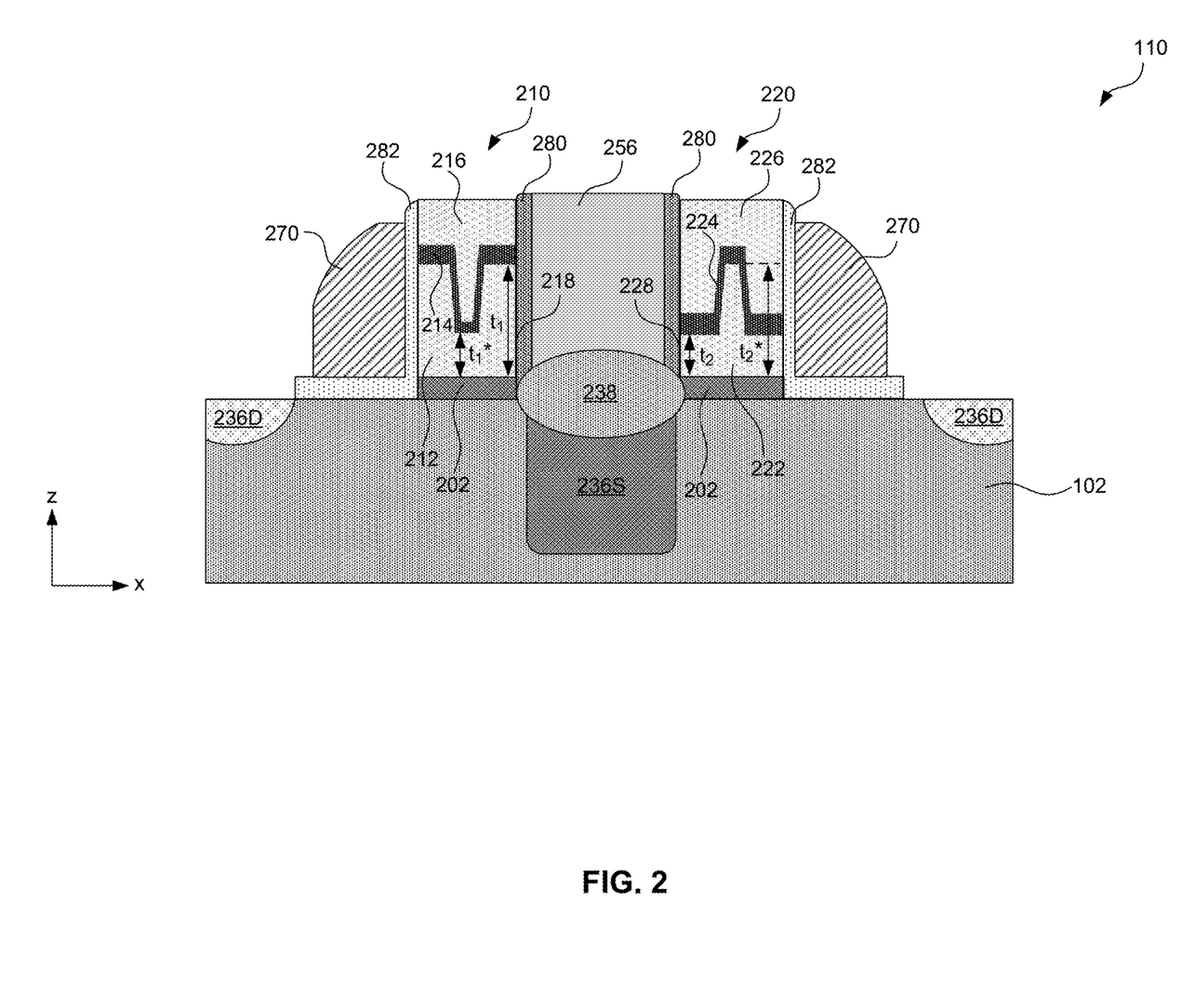

FIGS. 1-2 illustrate flash memory devices including flash memory cells having non-vertical step structure floating gates. FIGS. 3A-8 describe various fabrication processes of exemplary flash memory devices with enhanced coupling ratio and various data retention/erase performances, in accordance with various embodiments of the present disclosure. FIG. 9 is a flow diagram illustrating fabrication processes of exemplary flash memory devices with enhanced coupling ratio and various data retention/erase performance.

FIG. 1 is a cross-sectional view of an exemplary flash memory structure, in accordance with some embodiments of the present disclosure. Flash memory structure 100 in FIG. 1 includes a substrate 102, semiconductor devices 104, 106, and 108, flash memory cells 110, isolation structures 112 between the semiconductor devices 104, 106, and 108 and flash memory cells 110, an interlayer dielectric layer 120, interconnect structures 124, a first dielectric layer 130, a first metal layer 132, a first via 134, a second dielectric layer 140, a second metal layer 142, a second via 144, a third dielectric layer 150, and a third metal layer 152. Components of exemplary flash memory structure 100 are for illustration purposes and are not drawn to scale.

Substrate 102 can be a p-type substrate such as, for example, a silicon material doped with a p-type dopant (e.g., boron). In some embodiments, substrate 102 can be an n-type substrate such as, for example, a silicon material doped with an n-type dopant (e.g., phosphorous or arsenic). In some embodiments, substrate 102 can include, germanium, diamond, a compound semiconductor, an alloy semiconductor, a silicon-on-insulator (SOI) structure, any other suitable material, or combinations thereof. For example, the compound semiconductor can include silicon carbide, gallium arsenide, gallium phosphide, indium phosphide, indium arsenide, and/or indium antimonide, and the alloy semiconductor can include SiGe, GaAsP, AlInAs, AlGaAs, GaInAs, GaInP, and/or GaInAsP. Substrate 102 can have a thickness in a range from about 100 µm to about 3000 µm.

Isolation structures 112 can be formed in substrate 102 and between semiconductor devices 104-110 to avoid crosstalk. For example, isolation structures 112 are formed in substrate 102 and can be made of a dielectric material such as, for example, silicon oxide, spin-on-glass, silicon nitride, silicon oxynitride, fluorine-doped silicate glass (FSG), a low-k dielectric material, any other suitable insulating material, or combinations thereof. In some embodiments, isolation structures 112 can be shallow trench isolation (STI) structures formed by etching trenches in substrate 102. The trenches can be filled with insulating material, followed by a chemical-mechanical polishing (CMP) and etch-back process. Other fabrication techniques for isolation structures 112 are possible. Isolation structures 112 can include a multi-layer structure such as, for example, a structure with one or more liner layers. Isolation structures 112 can also be formed by depositing an enhanced gap fill layer to minimize or eliminate voids and seams in the gap fill material. Interlayer dielectric layer 120 can be formed on substrate 102 and isolation structures 112. Interlayer dielectric layer 120 can include a dielectric material, such as silicon oxide.

Flash memory cells 110 can be formed over the substrate 102 and covered by interlayer dielectric layer 120. Flash memory cells 110 can incorporate non-vertical (e.g., having an angle that is between 0 and 90° with reference to the z-direction) sidewall step-shaped floating gate that enhances a coupling ratio of flash memory cells. For example, a non-vertical sidewall profile of the floating gate can provide increased surface area and in turn provide an enhanced coupling ratio. The non-vertical sidewall profile can also improve the quality of an inter-gate dielectric layer of the flash memory cell such that the inter-gate dielectric layer can be uniform and conformal. Flash memory cells 110 can also incorporate multiple flash memory cells with various outer sidewall thicknesses of the floating gate that provide different data erase/retention capabilities on the same die (e.g., on the same chip). For example, a lower outer sidewall height of the floating gate structure decreases the contact surface between the floating gate and erase gate which in turn improves the data retention capability of the flash gate structure due to smaller efficiency erase area. On the other hand, a greater outer sidewall height of the floating memory cell increases the contact surface between the floating gate and erase gate which in turn improves the erase capability of the flash memory cell due to greater efficiency erase area. Other suitable devices can be included in flash memory structure 100. For example, semiconductor devices 104, 106, and 108, are also formed over substrate 102 and covered by interlayer dielectric layer 120 and include any suitable devices. In some embodiments, semiconductor device 104 can include static random-access memory (SRAM) devices, input/output devices, high voltage devices for use in radio frequency (RF) power applications (e.g., cellular infrastructure power amplifier applications), or combinations thereof. Conductive layers and structures that provide interconnections (e.g., wiring) between various doped features, circuitry, and input/output of the flash memory devices can be embedded in interlayer dielectric layer 120. For example, multilayer interconnect structure 124 can include conductive layers and structures, such as contacts, vias, and/or metal lines that provide electrical connections between semiconductor devices 104, 106, and 108, flash memory cells 110, and subsequently formed metal layers.

Flash memory structure 100 further includes first dielectric layer 130, first metal layer 132, first via 134, second dielectric layer 140, second metal layer 142, second via 144, third dielectric layer 150, and third metal layer 152 formed over interlayer dielectric structure 120 and to provide electrical connection for semiconductor devices 104, 106, and 108, flash memory cells 110, any suitable devices, and additional circuitry connected to flash memory structure 100.

First, second, and third dielectric layers 130, 140, and 150 can be intermetallic dielectric layers used to provide electrical insulation between interconnect conductive lines in flash memory structure 100. First, second, and third dielectric layers 130, 140, and 150 can be formed of dielectric materials such as, for example, silicon oxide, undoped silica glass, fluorinated silica glass, other suitable materials, or combinations thereof. In some embodiments, first, second, and third dielectric layers 130, 140, and 150 are formed using a low-k dielectric material (e.g., material with a dielectric constant less than 3.9). In some embodiments, first, second, and third dielectric layers 130, 140, and 150 can include two or more insulating material layers, which are not shown in FIG. 1 for simplicity.

In some embodiments, first, second, and third dielectric layers 130, 140, and 150 can be formed subsequently on substrate 102 and isolation structures 112. In some embodiments, first, second, and third metal layers 132, 142, and 152 can be formed in different metallization layers of a back-end-of-line (BEOL) structure. In some embodiments, first metal layer 132 can be formed in an M1 metallization layer, second metal layer 142 can be formed in an M2 metallization layer, and third metal layer 152 can be formed in an M3 metallization layer. M1, M2, and M3 metallization layers represent local interconnect levels that provide electrical connectivity in semiconductor structures. For example, M1 metallization layer can be a local interconnect that represents a first interconnect level and electrically connects to underlying conductive lines or semiconductor devices through one or more vias. In some embodiments, M2 metallization layer can represent a second interconnect level—above the first interconnect level—and electrically connects to underlying M1 metallization layer through one or more vias. Additionally, the M3 metallization layer can represent an additional interconnect level—above the second interconnect level and electrically connects to the underlying M2 metallization layer.

Alternatively, first, second, and third metal lines 132, 142, and 152 can be formed in other metallization layers of flash memory structure 100. First and second vias 134 and 144 are respectively formed within second and third dielectric layers 140 and 150 and are respectively electrically coupled to first, second, and third metal lines 132, 142, and 152. In some embodiments; the metal layers and vias described above can be formed using aluminum, aluminum alloy, copper, cobalt, any suitable metals, or combinations thereof. In some embodiments, flash memory structure 100 can further include other conductive lines or vias and are not illustrated in FIG. 1 for simplicity.

FIG. 2 is a cross-sectional view of exemplary flash memory cells, in accordance with some embodiments of the present disclosure. In some embodiments, the exemplary flash memory cell can be an enlarged view of flash memory cells 110 illustrated in FIG. 1. For simplicity, similar structures illustrated in FIGS. 1 and 2 share the same numerical labels. In some embodiments, flash memory cells 110 in FIG. 2 can be formed using any suitable materials.

Flash memory cells 110 include a first memory cell 210, a second memory cell 220, and an erase gate 256 formed between first and second memory cells 210 and 220. In some embodiments, first and second flash memory cells 210 and 220 incorporate floating gates 212/222 with non-vertical sidewall surfaces to enhance a coupling ratio between floating gates 212/222 and control gates 216/226. For example, the floating gates can have sidewalls that form an angle that is between 0 and 90° with reference to the z-direction. The enhanced coupling ratio provides the benefit of reduced programming voltage supply while maintaining flash memory cell performance. The non-vertical sidewalls of the floating, gate also enhance the uniformity and conformality of the inter-gate dielectric layer formed between the floating gate and the control gate. In addition, first and second flash memory cells 210 and 220 incorporate different outer sidewall thicknesses $t_1$ and $t_2$ of the non-vertical step shaped floating gate structures to provide flash memory cells on the same flash memory structure with different retention and erase performances.

In some embodiments, first flash memory cell 210 includes a taller floating gate outer sidewall that is adjacent to the erase gate, and in turn enhances the erase performance of the flash memory cell. In some embodiments, second flash memory cell 220 includes a shorter floating gate outer sidewall between the floating gate and the erase gate, and in turn enhances the data retention performance of the flash memory cell.

First flash memory cell 210 includes pad dielectric layers 202, a floating gate 212, an inter-gate dielectric layer 214, and a control gate 216. Similarly, second flash memory cell 220 includes a floating gate 222 formed on pad dielectric layer 202, an inter-gate dielectric layer 224, and a control gate 226. Pad dielectric layers 202 can be disposed on semiconductor substrate 102. In some embodiments, pad dielectric layers 202 can be formed of oxide and can be also referred to as a "tunnel oxide" or a "floating gate oxide." First and second flash memory cells 210 and 220 share a common source region 236S, a dielectric region 238 (e.g., inter-poly oxide), and an erase gate 256. In some embodiments, common source region 236S can be a heavily doped n-type or p-type region. Dielectric region 238 can be formed of oxide and referred to as an "inter-poly oxide (IPO)." Dielectric region 238 insulates overlaying erase gate 256 from underlying common source region 236S. Erase gate 256 can be formed over dielectric region 238 and positioned between two neighboring memory cells such as first and second flash memory cells 210 and 220. Further, spacers 280 can be disposed between erase gate 256 and first and second flash memory cells 210 and 220.

Flash memory cells 110 can also include word line 270 and drain regions 236D. Word line 270 can be formed on a side of spacer 282. Word line 270 and erase gate 256 can be formed on opposite sides of floating gate 212 and control gate 216. Similarly, word line 270 and erase gate 256 can be formed on opposite sides of gate structure including floating gate 222 and control gate 226. In some embodiments, word line 270 can be formed using any suitable conductive material such as, for example, metal, metal silicide, polycrystalline silicon, or a combination thereof. Drain regions 236D can be formed adjacent to word line 270. In addition, drain regions 236D and common source region 236S are on the opposite sides of each of the control gates 216 and 226. Drain regions 236D can be formed by implanting semiconductor substrate 102 with n-type or p-type impurities.

As shown in FIG. 2, first flash memory cell 210 includes an outer sidewall surface 218 between floating gate 212 and erase gate 256, and second flash memory cell 220 includes an outer sidewall surface 228 between floating gate 222 and erase gate 256. A thickness $t_1$ of floating gate 212 measured at its outer sidewall surface 218 can be greater than a thickness $t_2$ of floating gate 222 measured at its outer sidewall surface 228. Therefore, first flash memory cell 210 can have greater data retention performance than second flash memory cell 220, while second flash memory cell 220 can have greater data erase performance than first flash memory cell 210. In some embodiments, thickness $t_1$ can be in a range between about 2 nm and about 100 nm. In some embodiments, thickness $t_2$ can be in a range between about 1 nm and about 99 nm. In some embodiments, $t_1$ can be substantially equal to a thickness of floating poly silicon, so the range of $t_1$ can be determined by the thickness of poly silicon. The thickness range of $t_1$ can be determined by various suitable factors. For example, because a greater $t_1$ thickness provides better erase performance and a lower $t_1$ thickness provides better retention performance, the thickness $t_1$ can be a result of tradeoffs between erase and retention performances. In some embodiments, $t_1$ thickness can also be determined by process limitations. In some embodiments, $t_2$ can be the thickness after a floating gate etching back process, thus $t_2$ is lower than $t_1$.

First and second flash memory cells 210 and 220 also incorporate floating gates with a step-shaped step structure having non-vertical sidewalls to enhance the coupling ratio between respective floating gates 212/222 and control gates 216/226. As shown in FIG. 2, the step-shaped structure of floating gate 212 (e.g., the V-shaped structure having a recess) in flash memory cell 210 can provide a total contact surface area between floating gate 212 and control gate 216 that is greater than a planar contact surface. In some embodiments, floating gate thickness $t_1^*$ that is measured between a bottom surface of the recess and a top surface of pad dielectric layer 202 can be in a range between about 1 nm and about 99 nm. Similarly, the step-shaped structure of floating gate 222 (e.g., the reverse V-shaped structure having a protruding structure) in flash memory cell 220 can provide a total contact surface area between floating gate 222 and control gate 226 that is greater than a planar contact surface. In some embodiments, the floating gate thickness $t_2^*$ that is measured between a top surface of the protruding structure and a top surface of pad dielectric layer 202 can be in a range between about 2 nm and about 100 nm. Accordingly, control gates 216 and 226 take the shapes of step-shaped floating gates 212 and 222. In addition, inter-gate dielectric layers 214 and 224 can be uniformly and deposited between respective floating gates and control gates and along the contours (having the same or similar shape) of step-shaped structures due to the non-vertical sidewalls that enhances film continuity at corners of adjoining sidewalls and planar surfaces. In some embodiments, more than one recess or protruding structure can be included in the step-shaped floating gates. In some embodiments, the V-shaped and reverse V-shaped structures of floating gates 212 and 222 can be formed during the same patterning and etching processes. In such processes, the respective recess and protruding portions of floating gates 212 and 222 are formed during the same etching process and the resulting floating gate thickness $t_1^*$ and $t_2$ are substantially the same. In some embodiments, top surfaces of floating gates 212 and 222 are substantially level, e.g., floating gate thicknesses $t_1$ and $t_2^*$ are substantially the same. In some embodiments, pattern density; aspect ratios, and etching conditions can cause variations in the floating gate thickness even during the same etching process. In some embodiments, floating gates 212 and 222 can be patterned and etched using different patterning and etching processes, for example, one of the floating gates 212 or 222 can be covered by a masking material while the other floating gate is being patterned and etched.

Figure 3A:
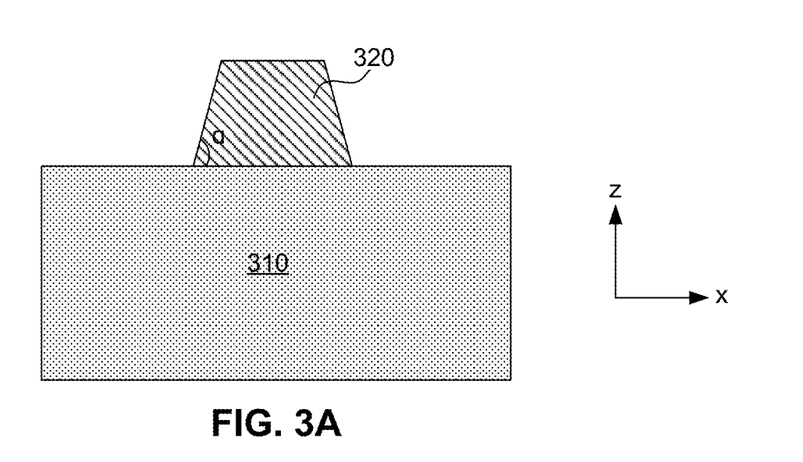
Figure 3B:
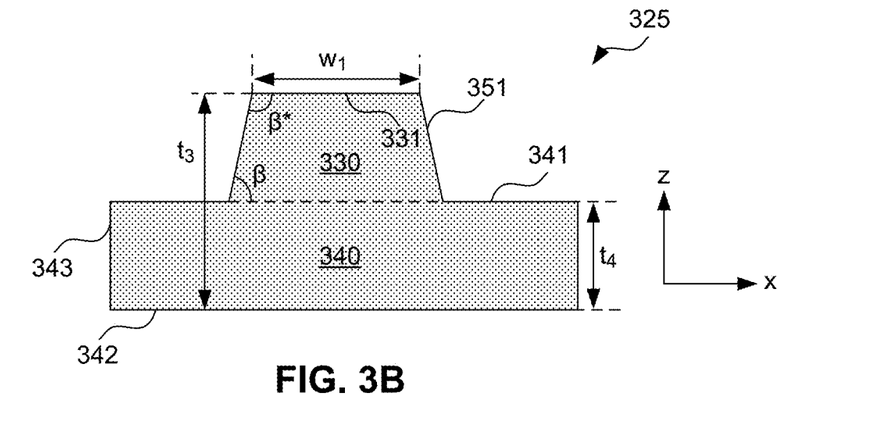
Figure 3C:
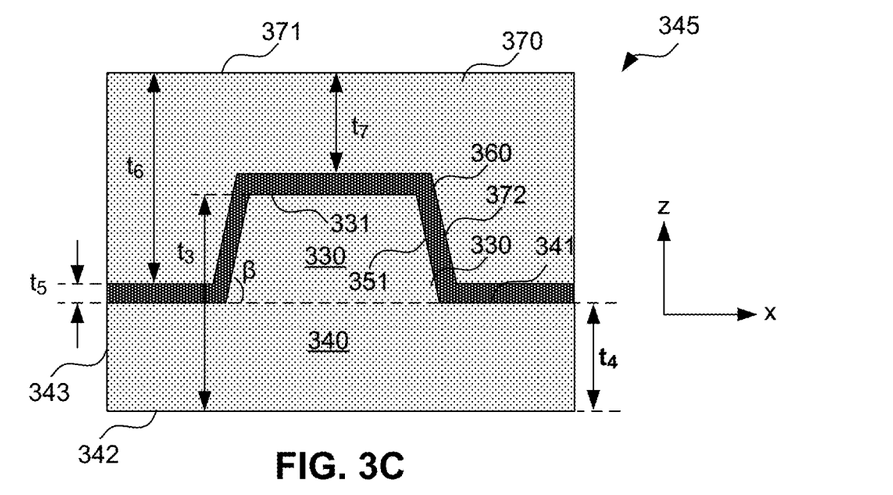
Figure 4A:
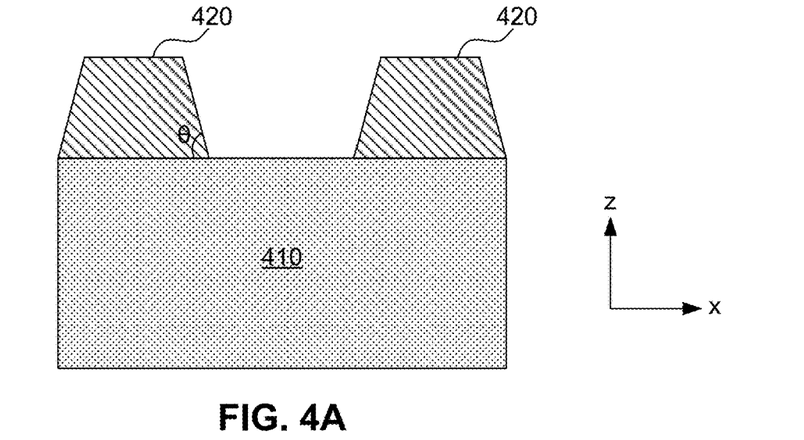
Figure 4B:
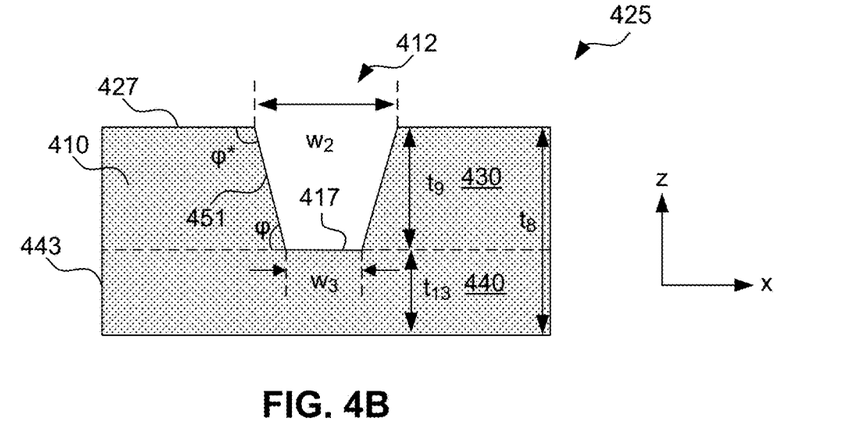
Figure 4C:
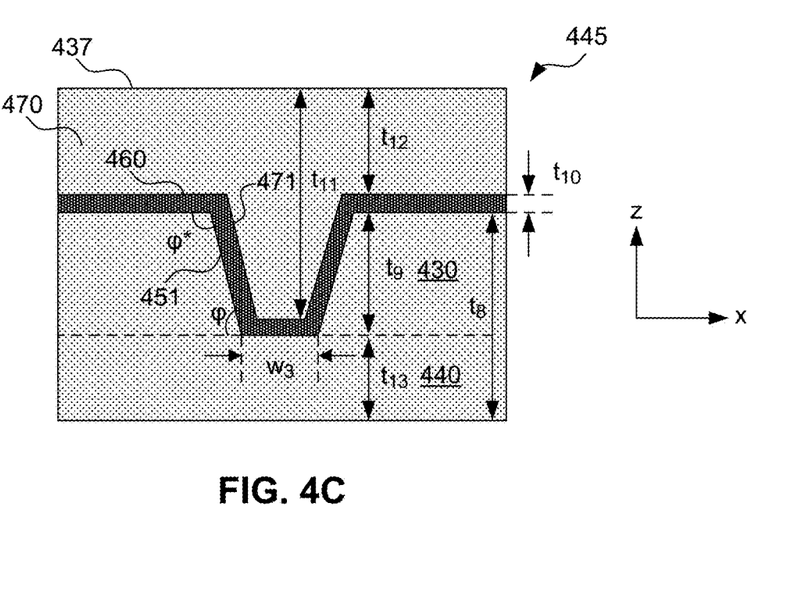

FIGS. 3A-4C illustrate fabrication processes of partially-fabricated exemplary flash memory cells having non-vertical sidewall floating gates and various outer side wall thicknesses, in accordance with some embodiments of the present disclosure. Specifically, FIGS. 3A-3C illustrate floating gates with shorter outer sidewalls and FIGS. 4A-4C illustrate floating gates with taller outer sidewalls.

FIG. 3A illustrates a floating gate material 310 and a patterned masking layer 320 formed on a top surface of floating gate material 310, according to some embodiments.

In some embodiments, floating gate material 310 can be formed of polycrystalline silicon and can be implanted with n-type or p-type impurities, followed by an annealing process to activate the implanted impurity. Patterned masking layer 320 can be formed on a top surface of floating gate material 310. Composition of masking layer 320 can include a photoresist, a hard mask, and/or other suitable materials. Examples of hard mask can include silicon nitride, silicon oxide, and/or other suitable materials. The patterning process can include forming a photoresist layer over the top surface of floating gate material 310, exposing the photoresist layer to a pattern, performing post-exposure bake processes, and developing the photoresist layer to form a masking element that includes the photoresist. The masking element can then be used to protect regions of floating gate material 310 while one or more etching processes sequentially removes exposed floating gate material to form the step-shaped structure. The one or more etching processes can continue until a nominal step depth is achieved. Sidewall profiles of patterned masking 320 can be transferred downwards during the formation of underlying step-shaped structure of floating gate material 310. Therefore, sidewall angle $\alpha$ of patterned masking layer 320 measured between a sidewall and bottom surface of patterned masking layer 320 can affect the sidewall angle of the formed step-shaped structure of a floating gate. In some embodiments, sidewall angle $\alpha$ of patterned masking layer 320 can be in a range between about 30° and about 90°. For example, sidewall angle $\alpha$ can be between about 30° and about 45°, between about 45° and about 60°, between about 60° and about 90°. In some embodiments, sidewall angle $\alpha$ can be about 45°. Sidewall angle $\alpha$ can be achieved by using suitable photolithography tool such as, immersion photolithography systems using 193 nm wavelength light or EUV photolithography systems. For example, lithography parameters such as focus and energy settings can be adjusted to form a nominal sidewall angle after the lithography process.

FIG. 3B illustrates a floating gate 325 after etching floating gate material 310 using patterned masking layer 320 to form a step-shaped structure, according to some embodiments. Floating gate 325 includes a top portion 330 and a bottom portion 340. As shown in FIG. 3B, top portion 330 protrudes from bottom portion 340. Top portion 330 is shown in FIG. 3B to have a trapezoidal cross section but can have any suitable cross-sectional shape. In addition, top portion 330 can have any suitable shapes in a plan view. For example, top portion 330 can have square shape, circular shape, polygonal shape, triangular shape, or any other shape. Top portion 330 includes a top surface 331 having width $w_1$ and sidewall surfaces 351. Bottom portion 340 includes a top surface 341 and an opposing bottom surface 342. Bottom portion 340 also includes one or more outer sidewall surfaces 343 that can be electrically coupled to a subsequently formed adjacent erase gate. Sidewall surfaces 351 connect top surfaces 331 and 341 of top and bottom portions 330 and 340, respectively. As shown in FIG. 3B, top surfaces 331 and 341 of top and bottom portions 330 and 340 are not level (e.g., on horizontal planes that are located at different heights on the z axis.) In some embodiments, top surface 331 is above top surface 341. In some embodiments, sidewall angle $\beta$ measured between sidewall surface 351 and top surface of bottom portion 340 can be an acute angle (e.g., less than 90° but greater than 0). In some embodiments, sidewall angle $\beta^*$ measured between sidewall surface 351 and top surface of top portion 330 can be an obtuse angle (e.g., greater than 90° but less than 180°). In some embodiments, sidewall angle $\beta$ can be in a range between about 30° and about 90°. For example, sidewall angle β can be between about 30° and about 45°, between about 45° and about 60°, between about 60° and about 90°. In some embodiments, sidewall angle β can be about 45°. A nominal value of sidewall angle β can be determine by adjusting sidewall angle α and various suitable processing parameters of the one or more etching processes to form the step-shaped structure. As floating gate 325 can be formed using one or more photolithography processes, different lithography focus and energy settings of the lithography tools can be used. For example, plasma energy and ion beam focus of a dry etching tool can be adjusted to form a photoresist pattern with different sidewall angles The non-vertical step-shaped structure can also further decrease contact surface area between floating gate 325 and a subsequently formed control gate. In some embodiments, the side wall of floating gate can be lowered by one or more etching processes. In some embodiments, a thickness $t_3$ between top surface 331 of top portion 330 and bottom surface 342 of bottom portion 340 can be in a range between about 2 rum and about 100 nm. For example, thickness $t_3$ can be between about 2 nm and about 30 nm, between about 30 nm and about 50 nm, or between about 50 nm and about 100 nm. In some embodiments, a thickness $t_4$ between respective top and bottom surfaces 341 and 342 of bottom portion 340 can be in a range between about 1 nm and about 99 nm. For example, thickness $t_4$ can be between about 1 nm and about 30 nm, between about 30 nm and about 50 nm, or between about 50 nm and about 99 nm. Thickness $t_4$ is also the thickness of outer sidewall 343 of bottom portion 340. A greater thickness $t_4$ can provide the benefit of improved data retention performance of the flash memory cell, while a smaller thickness of $t_4$ can provide the benefit of improved erase performance of the flash memory cell.

FIG. 3C illustrates a flash memory cell gate structure 345 after inter-gate dielectric layer and control gate are formed, according to some embodiments. In some embodiments, inter-gate dielectric layer 360 is deposited on exposed surfaces of floating gate 325. As shown in FIG. 3C, sidewall 351 can be slanted rather than perpendicular to top surface 341 of bottom portion 340; for example, angle β can be an acute angle rather than 90°. The non-perpendicular connections between sidewall surfaces and top surfaces can improve continuity and conformality of inter-gate dielectric layer deposition by reducing film discontinuities at sharp corners (e.g., corners where two surfaces are adjoined at 90°). In some embodiments, inter-gate dielectric layer 360 can include an Oxide-Nitride-Oxide (ONO) structure having a silicon oxide layer, a silicon nitride layer, and a silicon oxide layer over the silicon nitride layer. In some embodiments, inter-gate dielectric layer 360 can be formed of a single oxide layer, a single nitride layer, a single high-k dielectric layer, a single silicon oxynitride layer, or the like, or multiple layers thereof. In some embodiments, inter-gate dielectric layer 360 can cover the entire floating gate 325 such that inter-gate dielectric layer 360 is further formed on the sidewall of the floating gate 325. In some embodiments, inter-gate dielectric layer 360 only covers top surfaces 331 and 341 as well as sidewall surfaces 351. A floating gate spacer (not shown in FIG. 3C) can be disposed at the outer sidewall 343 so as to enclose floating gate 325. Inter-gate dielectric layer 360 can be formed by any suitable deposition technique such as, for example, chemical vapor deposition (CVD), plasma-enhanced CVD (PECVD), physical vapor deposition (PVD), atomic layer deposition (ALD), any other suitable deposition techniques, or combinations thereof. In some embodiments, thickness $t_5$ of inter-gate dielectric layer 360 can be in a range between about 10 nm and about 900 nm. For example, thickness $t_5$ can be between about 10 nm and about 100 nm, between about 100 nm and about 500 nm, or between about 500 nm and about 900 nm. The thickness of dielectric layer can provide different separations between the floating gate and the control gate. Further, the separations can affect the coupling ratio between the floating gate and the control gate because the capacitance between the floating and control gates is inversely proportional to the separations (e.g., $C=\varepsilon A/d$).

Control gate 370 can be deposited over the top surfaces of inter-gate dielectric layer 360 such that inter-gate dielectric layer 360 is sandwiched between floating gate 325 and control gate 370. For example, inter-gate dielectric layer 360 can be interposed and in contact (e.g., in direct or physical contact) with floating gate 325 and control gate 370. In some embodiments, control gate 370 can include polycrystalline silicon and deposited using any suitable deposition technique such as, for example, CVD, PECVD, PVD, ALD, any other suitable deposition techniques, or combinations thereof. Control gate 370 can have a planar top surface 371 achieved by performing a planarization process after the deposition process for forming control gate 370 has been completed. Thickness $t_6$ measured between top surface 371 and inter-gate dielectric layer 360 formed on top surface 331 can be between about 2 nm and about 100 nm. For example, thickness $t_6$ can be between about 2 nm and about 30 nm, between about 30 nm and about 50 nm, or between about 50 nm and about 100 nm. Thickness $t_7$ measured between top surface 371 and inter-gate dielectric layer 360 formed on top surface 341 can be between about 1 nm and about 99 nm. For example, thickness $t_6$ can be between about 1 nm and about 30 nm, between about 30 nm and about 50 nm, or between about 50 nm and about 99 nm. $t_6$ can substantially equal to the original thickness of control gate poly silicon, so the range of $t_6$ can be determined by the thickness of the control gate poly silicon. In some embodiments, $t_7$ is lower than $t_6$ due to the step-shaped floating gate profile. In some embodiments, as a thickness gap between $t_6$ and $t_7$ becomes larger, the control gate and floating gate contact area is also greater which will in turn increase the capacitance between control gate and floating gate and provides a greater coupling ratio between the control and floating gates. In some embodiments, the sum of thicknesses $t_3$ and $t_7$ equals to the sum of thicknesses $t_4$ and $t_6$. A sidewall 372 of control gate 370 contours (having the same or similar shape) sidewall 351 of floating gate 325, in some embodiments. For example, sidewall 372 can have a similar shape as sidewall 351.

FIG. 4A illustrates a floating gate material 410 and a patterned masking layer 420 formed on a top surface of floating gate material 410, according to some embodiments. In some embodiments, floating gate material 410 can be similar to floating gate material 310 described in FIG. 3A and is not described in detail here for simplicity. Patterned masking layer 420 can be used to protect portions of floating gate material 410 during one or more etching processes to form recesses in floating gate material 410, Structure and formation processes of patterned masking layer 420 can be similar to those of patterned masking layer 310 described in FIG. 3A and is not described in detail here for simplicity. Sidewall angle θ of patterned masking layer 420 measured between a sidewall and bottom surface of patterned masking layer 420 can be between about 30° and about 90°. For example, sidewall angle θ can be between about 30° and about 45°, between about 45° and about 60°, between about 60° and about 90°. In some embodiments, sidewall angle θ can be about 45°.

FIG. 4B illustrates a floating gate 425 after etching floating gate material 410 using patterned masking layer 420 to form one or more recesses, according to some embodiments. Floating gate 425 includes a recess 412 formed in a top portion 430 and includes a trapezoidal cross-sectional profile but can have any suitable cross-sectional shape. In addition, recess 412 can have any suitable shapes in a plan view. For example, recess 412 can have a square shape, a circular shape, a polygonal shape, a triangular shape, any other shape, or combinations thereof. Recess 412 can have width $w_2$ measured at its top opening and width $w_3$ measured at its bottom surface 417. In some embodiments, $w_2$ can be in a range between about 1 nm and about 100 nm. In some embodiments, $w_3$ can be in a range between about 1 nm and about 100 nm. In some embodiments, thickness $t_9$ of recess 412 can be in a range between about 1 nm and about 99 nm. Recess 412 can include sidewall surfaces 451. In some embodiments, sidewall angle φ measured between sidewall surface 451 and bottom surface 417 of recess 412 can be an acute angle (e.g., less than 90° and greater than 0). In some embodiments, sidewall angle φ* measured between sidewall surface 451 and top surface 427 of floating gate 425 can be an obtuse angle (e.g., greater than 90° and less than 180°). The non-vertical step-shaped structure can also further increase contact surface area between floating gate 425 and subsequently formed control gate. As the contact surface area increases between floating gate and control gate, the capacitance between the floating and control gates also increases because capacitance is proportional to the contact surface area.

Floating gate 425 also includes a second portion 440 formed under first portion 430. Second portion 440 includes one or more outer sidewall surfaces 443 that can be electrically coupled to a subsequently formed adjacent erase gate. Sidewall surfaces 451 connect top surface 427 of floating gate 425 and bottom surface 417 of recess 412. As shown in FIG. 4B, bottom surface 417 and top surface 427 are not level (e.g., on horizontal planes that have different heights on the z axis.) In some embodiments, top surface 427 is above bottom surface 417. Thickness $t_8$ is also the thickness of outer sidewall surface 443. As described above, a greater thickness $t_8$ can provide the benefit of improved data retention performance of the flash memory cell, while a smaller thickness of $t_8$ can provide the benefit of improved erase performance of the flash memory cell.

FIG. 4C illustrates a flash memory cell gate structure 445 after the inter-gate dielectric layer and control gate are formed, according to some embodiments. In some embodiments, inter-gate dielectric layer 460 is deposited on exposed surfaces of floating gate 425. As shown in FIG. 4C, sidewalk 451 can be slanted rather than perpendicular to top surface 427 of flash memory cell gate structure 445. Similar to the non-perpendicular connections between sidewall surfaces and top surfaces described in FIG. 3C, sidewalls 451 can improve continuity and conformality of inter-gate dielectric layer deposition by reducing film discontinuities at sharp corners (e.g., corners where two surfaces are adjoined at 90°). In some embodiments, inter-gate dielectric layer 460 can be similar to inter-gate dielectric layer 360 described in FIG. 3C and is not described in detailed here. Inter-gate dielectric layer 460 can be form by any suitable deposition techniques such as, for example, PECVD, PVD, ALD, any other suitable deposition techniques, or combinations thereof. In some embodiments, thickness $t_{10}$ of inter-gate dielectric layer 460 can be in a range between about 10 nm and about 900 nm.

Control gate 470 can be deposited over the top surfaces of inter-gate dielectric layer 460 such that inter-gate dielectric layer 460 is sandwiched between floating gate 425 and control gate 470. Control gate 470 can be formed using similar material and deposition process as control gate 370 described above in FIG. 3C. Thickness $t_{11}$ measured between top surface 437 of flash memory cell gate structure 445 and inter-gate dielectric layer 460 formed on bottom surface 417 can be between about 2 nm and about 100 nm. Thickness $t_{12}$ measured between top surface 437 and inter-gate dielectric layer 460 formed on top surface 427 can be between about 1 nm and about 99 nm. As $t_{11}$ can be substantially equal to the thickness of control gate poly silicon, the thickness range of can be determined by the thickness of poly silicon. In some embodiments, $t_{12}$ can be lower than $t_{11}$ due to the step-shaped floating gate profile. In some embodiments, as the thickness gap between $t_{11}$ and $t_{12}$ becomes larger, the control gate and floating gate contact area also becomes larger increases the capacitance between the control and floating gates, which in turn increases the coupling ratio between the control and floating gates. In some embodiments, the sum of thicknesses $t_8$ and $t_{12}$ equals to the sum of thicknesses $t_{11}$ and $t_{13}$. A sidewall 471 of control gate 470 contours (having the same or similar shape) sidewall 451 of floating gate 425, in some embodiments. For example, sidewall 471 can have a similar shape as sidewall 451.

In some embodiments, the V-shaped and reverse V-shaped floating gate structures of floating gates 325 and 425 respectively described in FIGS. 3A-3C and FIGS. 4A-4C can be formed during the same patterning and etching processes, similar to floating gates 212 and 222 described in FIG. 2. In some embodiments, the respective recess and protruding portions of floating gates 325 and 425 are formed during the same etching process and the resulting floating gate thickness $t_3$ of floating gate 325 can substantially equal to $t_8$ of floating gate 425. In some embodiments, floating gate thickness $t_4$ of floating gate 325 can substantially equal to $t_{13}$ of floating gate 425. In some embodiments, pattern density, aspect ratios, and etching conditions can cause variations in the floating gate thickness even during the same etching process.

FIGS. 5-8 illustrate fabrication processes of partially-fabricated exemplary flash memory cells having non-vertical sidewall floating gates and various outer side wall thicknesses, in accordance with some embodiments of the present disclosure.

Figure 5:
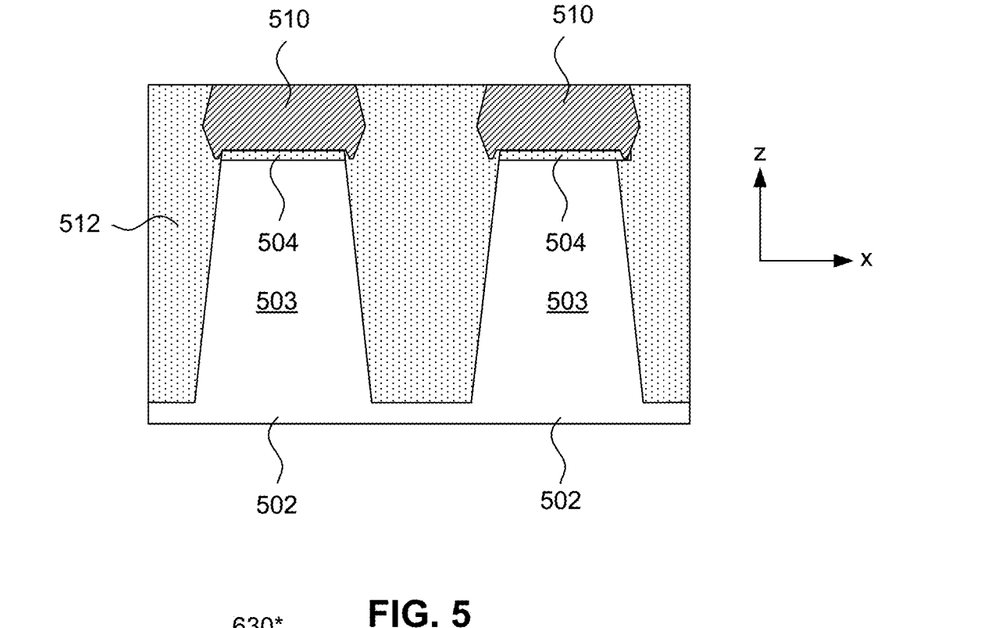

FIG. 5 illustrates a partially-fabricated flash memory cell including a substrate 502, active regions 503, pad dielectric layers 504, a floating gate material 510, and isolation materials 512. Substrate 502 can be similar to substrate 102 described above in FIGS. 1-2. Substrate 502 can include one or more active regions 503. Pad dielectric layers 504 are formed on top surfaces of active regions 503, and floating gate materials 510 are formed on pad dielectric layers 504. Isolation materials 512 can be similar to materials that are used to form isolation structures 112 described in FIG. 1. Other structures such as, for example, source/drain regions, interconnects, word lines, contacts, and any other suitable structures are not illustrated in 5-8 for simplicity.

Figure 6:
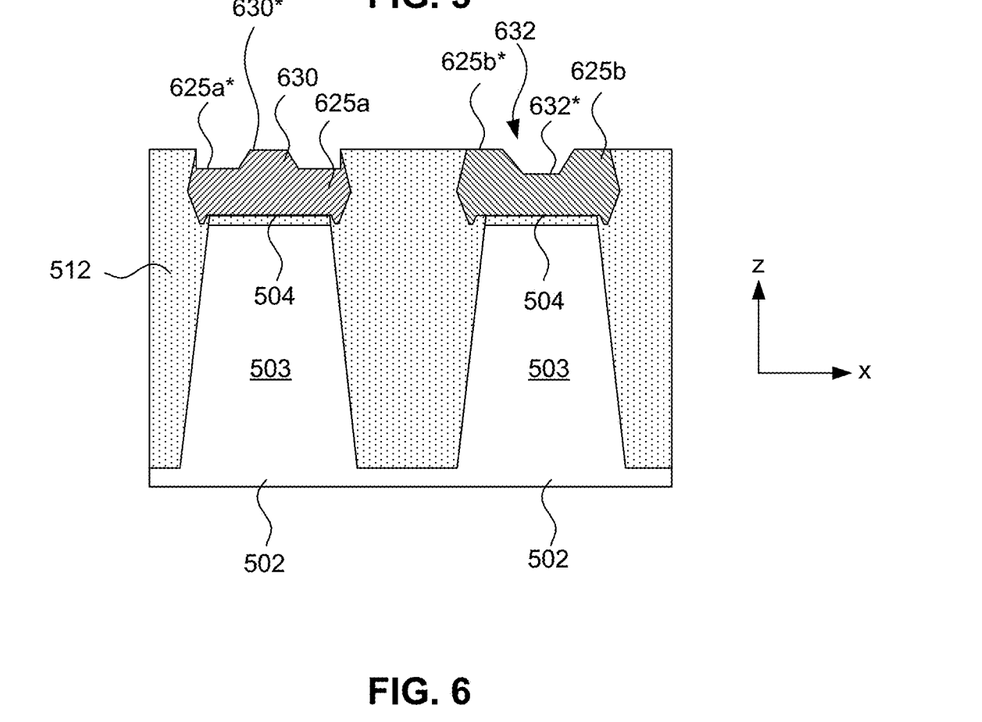

FIG. 6 illustrates a partially-fabricated flash memory cell after non-vertical sidewall step structures are formed in floating gate material to form floating gates, in accordance with some embodiments of the present disclosure. As shown in 6, one or more protruding structures 630 are formed in floating gate 625a, and one or more recesses 632 are formed in floating gate 625b. Protruding structures 630 can be similar to protruding structures 330 described in FIGS. 3B and 3C. Recesses 632 can be similar to recesses 412 described in FIG. 4B. In some embodiments, floating gates 625a and 625b are formed by the same patterning process and etching processes, similar to the formation of floating gate structures 325 and 425 described above in FIGS. 3A-3C and FIGS. 4A-4C. Therefore, top surfaces 630* of protruding structures 630 can be substantially level with top surface 625b* of gate structure 625b. In some embodiments, top surface 625a* of floating gate 625a can be substantially level with bottom surface 632* of recess 632. As described above, a greater thickness of outer sidewalk can provide the benefit of improved data retention performance of the flash memory cell, while a smaller thickness of outer sidewall can provide the benefit of improved erase performance of the flash memory cell. In addition, the non-perpendicular connections between sidewall surfaces and top surfaces can improve continuity and conformality of inter-gate dielectric layer deposition by reducing film discontinuities at sharp corners. The non-vertical step-shaped structure can also further increase contact surface area between floating gate 425 and subsequently formed control gate. As the contact surface area increases between floating gate and control gate, the capacitance between the floating and control gates also increases because capacitance is proportional to the contact surface area.

Figure 7:
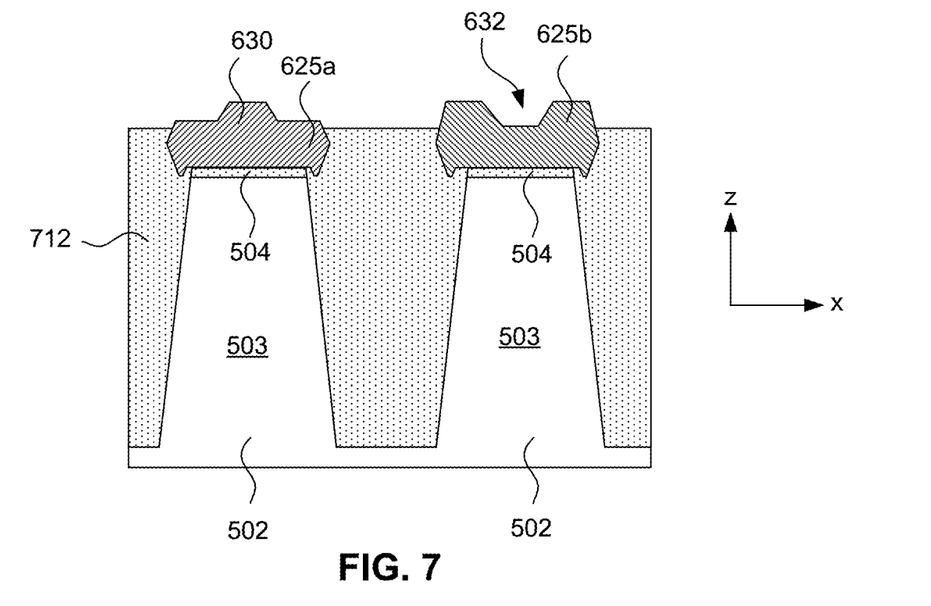

FIG. 7 illustrates a partially-fabricated flash memory cell after isolation material is etched back to expose a portion of the floating gate structures having non-vertical sidewall step structures, in accordance with some embodiments of the present disclosure. In some embodiments, isolation material 512 is etched back by one or more material removal processes to form isolation structures 712. In some embodiments, suitable patterning processes such as photolithography processes can be used to cover structures such as floating gates and periphery area (e.g., logic devices) using a masking material. In some embodiments, the patterning process can include depositing a photoresist layer, exposing the photoresist layer to a pattern, performing post-exposure bake processes, and developing the photoresist layer to form a masking element. The masking element can be used to protect regions of floating gate structures and peripheral regions while one or more etching processes etch back the exposed isolation material. The one or more etching processes can continue until a nominal amount of isolation material is etched back. In some embodiments, the one or more material removal processes can include any suitable etching processes such as, for example, dry plasma etching process, aching process, wet etching process, or combinations thereof. In some embodiments, a dry plasma etching process followed by a hydrofluoric acid etching process can be used to etch back isolation material 512.

Figure 8:
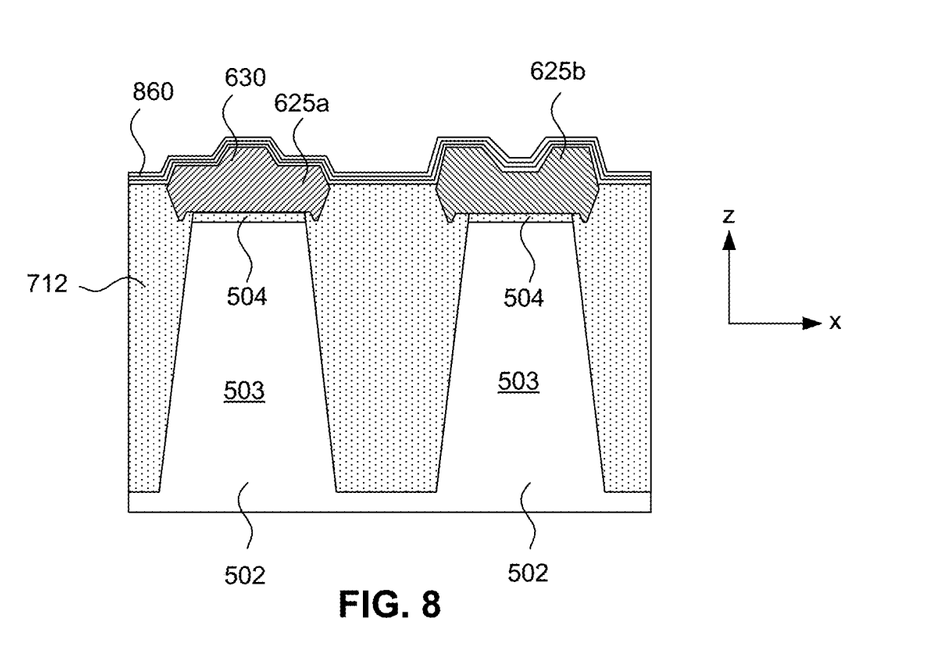
Figure 9:
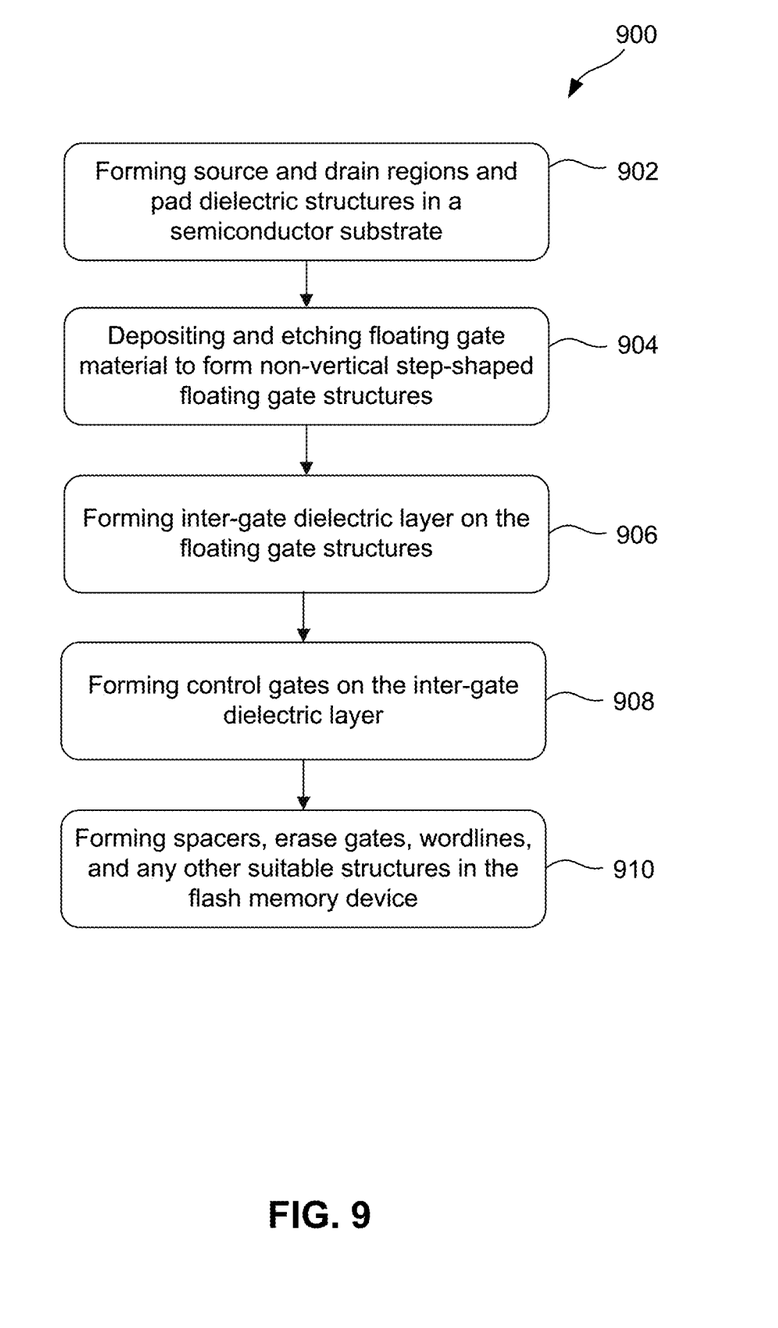
FIG. 9 is a flow diagram of an exemplary method for forming a flash memory device, in accordance with some embodiments.

FIG. 8 illustrates a partially-fabricated flash memory cell after the inter-gate dielectric layer is formed on the floating gate structures with non-vertical sidewall step structures, in accordance with some embodiments of the present disclosure. The non-perpendicular connections between sidewall surfaces and top surfaces eliminate sharp corners to improve continuity and conformality of inter-gate dielectric layer deposition by reducing film discontinuities. Inter-gate dielectric layer 860 can include one or more suitable layers. For example, inter-gate dielectric layer 860 can include an ONO structure having a silicon oxide layer, a silicon nitride layer, and a silicon nitride layer. Erase gates are subsequently formed between floating gates 625a and 625b and are not illustrated in FIG. 8 for simplicity. Further, any other suitable structures such as, for example, source/drain structures, word lines, spacers, contacts, interconnects, can be formed in flash memory device but are not illustrated in FIG. 8. For example, flash memory cells formed based on floating gates 625a and 625b can share a common source region, a dielectric region (e.g., inter-poly oxide), and one or more erase gates. In some embodiments, the common source region can be formed between floating gates 625a and 625b, and can be a heavily doped n-type or p-type region. A dielectric region can be formed between floating gates 625a and 625b and formed of oxide material. Similar to dielectric region 238, the dielectric region can insulate subsequently formed erase gate from the underlying common source region. Similar to erase gate 256, the erase gate can be formed over the dielectric region and positioned between two neighboring floating gates 625a and 625b. Further, spacers similar to spacers 280 can be disposed between the erase gate and floating gates 625a and 625b.

FIG. 9 is a flow diagram of an example method 900 for forming flash memory cells having non-vertical sidewall step-structure floating gate structures, in accordance with some embodiments of the present disclosure. Other operations in method 900 can be performed and operations of method 900 can be performed in a different order and/or vary.

At operation 902, source and drain regions and pad dielectric structures are formed in a semiconductor substrate, in accordance with some embodiments of the present disclosure. The semiconductor substrate can be a p-type substrate or an n-type substrate. In some embodiments, the semiconductor substrate can include other suitable materials or structures. In some embodiments, the source and drain regions can be an n-type doped silicon layer or a p-type doped silicon layer. An example of the substrate can be substrate 102 described in FIGS. 1 and 2. Examples of the source and drain regions can be source 236S and 236D, respectively, which are described in FIGS. 1 and 2. The pad dielectric structure can be formed on the semiconductor substrate and between the source and drain regions. The pad dielectric structure can be formed through a blanket deposition followed by a patterning and etching process. In some embodiments, the pad dielectric structure can include a high-k material. The pad dielectric structure can be formed of oxide and can be also referred to as a "tunnel oxide" or a "floating gate oxide." An example of the pad dielectric structure can be pad dielectric layer 202 described in FIG. 2.

At operation 904, floating gate material is deposited and etched to form non-vertical step-shaped floating gates, in accordance with some embodiments of the present disclosure. The floating gate material can be deposited on pad dielectric layers using any suitable deposition methods. In some embodiments, floating gate material can be polycrystalline silicon deposited using CVD, PVD, PECVD, ALD, any suitable deposition method, or combinations thereof. In some embodiments, one or more protruding structures are formed in the floating gate material. In some embodiments, one or more recesses are formed in the floating gate material. The protruding structures and recesses can be formed by forming a patterned masking layer on the top surface of floating gate material, forming a non-vertical sidewall profile for the patterned masking layer, and performing one or more etching processes on the floating gate material to form floating gates having non-vertical step-shaped structures.

In addition, the non-vertical step-shaped floating gate can also have various outer sidewall heights providing different data retention or erase capabilities. For example, a greater outer sidewall thickness can provide the benefit of improved data retention performance of the flash memory cell, while a smaller outer sidewall thickness can provide the benefit of improved erase performance of the flash memory cell. In addition, the non-perpendicular connections between sidewall surfaces and top surfaces can improve continuity and conformality of inter-gate dielectric layer deposition by reducing film discontinuities at sharp corners (e.g., corners where two surfaces are adjoined at 90°). The non-vertical step-shaped structure can also further increase contact surface area between the floating gate and subsequently formed control gate. Examples of protruding structures can be protruding structures 330 described in FIGS. 3B and 3C. Examples of recesses can be recesses 412 described in FIG. 4B.

At operation 906, an inter-gate dielectric layer is formed on the floating gate structures, in accordance with some embodiments of the present disclosure. Continuity and conformality of the inter-gate dielectric layer can be improved by reducing film discontinuities at sharp corners due to the non-perpendicular connections between sidewall surfaces and top surfaces. In some embodiments, the inter-gate dielectric layer can include an ONO structure having a silicon oxide layer, a silicon nitride layer, and a silicon oxide layer over the silicon nitride layer. In some embodiments, the inter-gate dielectric layer can be formed of a single oxide layer, a single nitride layer, a single high-k dielectric layer, a single silicon oxynitride layer, or multiple layers thereof. Examples of inter-gate dielectric layers can be inter-gate dielectric layers 214, 360, 460, and 860 described above in FIGS. 2, 3C, 4C, and 8.

At operation 908, control gates are formed on the inter-gate dielectric layer, in accordance with some embodiments of the present disclosure. Control gates are formed over the top surfaces of the inter-gate dielectric layers such that the inter-gate dielectric layer is sandwiched between the floating gate and the control gate. For example, the inter-gate dielectric layer can be interposed and in contact (e.g., in direct or physical contact) with the floating gate and the control gate. In some embodiments, the control gate can include polycrystalline silicon and deposited using any suitable deposition techniques such as, for example, CVD, PECVD, PVD, ALD, any other suitable deposition techniques, or combinations thereof. The control gate can also have a planar top surface, which can be formed by a planarization process. Examples of control gates can be control gates 216, 226, 370, and 470 described in FIGS. 2, 3C, and 4C.

At operation 910, spacers, erase gates, word lines, and any other suitable structures are formed in the flash memory device, in accordance with some embodiments of the present disclosure. Erase gates and word lines can be formed adjacent to a gate structure, including a non-vertical step-shaped floating gate and a control gate structure. Spacers can be formed between the erase gate and the gate structure that includes the floating gate and control gate. Examples of erase gates and word lines can be erase gate 256 and word lines 170 described in FIG. 2, respectively.

Various embodiments in accordance with this disclosure describe structures and methods of enhancing coupling ratio in flash memory cells and fabricating flash memory cells with different erase and retention performance (e.g., on one chip). In some embodiments, non-vertical step-shaped floating gate structures includes step-shaped floating gate structures with non-vertical sidewalls formed between the floating gate and control gate of the flash memory cells. In some embodiments, flash memory cells on the same chip can include non-vertical step-shaped floating gate structures with different outer sidewall thicknesses. For example, a greater outer sidewall height of the floating gate structure increases the contact surface between the floating gate and erase gate which in turn improves the data retention capability of the flash memory cell. On the other hand, a lower outer sidewall height of the floating gate structure decreases contact surface between the floating gate and erase gate which in turn improves the erase capability of the flash memory cell.

In some embodiments a flash memory cell includes a substrate and a floating gate structure over the substrate. The floating gate structure includes a first portion having a first top surface and a first thickness. The floating gate structure also includes a second portion having a second top surface and a second thickness that is different from the first thickness. The floating gate structure further includes a sidewall surface connecting the first and second top surfaces, and a first angle between the first top surface and the sidewall surface of the floating gate structure is an obtuse angle. The flash memory cell also includes a control gate structure over the first and second portions of the floating gate structure.

In some embodiments a flash memory structure includes a first floating gate structure. The floating gate structure includes a first portion with a first top surface and a first thickness and a second portion with a second top surface and a second thickness that is different from the first thickness and a first outer sidewall having a first outer sidewall thickness. The flash memory structure also includes a second floating gate structure that includes a third portion with a third top surface and a third thickness. The second floating gate structure further includes a fourth portion with a fourth top surface and a fourth thickness that is different from the third thickness and a second outer sidewall having a second outer sidewall thickness. The first and second outer sidewall thicknesses are different.

In some embodiments, a method for forming flash memory cells includes depositing a floating gate material over a substrate and etching the floating gate material with a masking layer to form first and second portions of the floating gate material. The first portion includes a first top surface and a first thickness. The second portion includes a second top surface and a second thickness that is different from the first thickness. The method also includes depositing a dielectric layer on the first and second top surfaces and on a sidewall surface connecting the first and second top surfaces. A first angle between the first top surface and the sidewall surface is an obtuse angle. The method also includes forming a control gate structure over the dielectric layer.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A flash memory cell, comprising:
a substrate;
a floating gate structure over the substrate, wherein the floating gate structure comprises:
a first portion having a first top surface and a first thickness;
a second portion having a second top surface and a second thickness that is different from the first thickness; and
a sidewall surface connecting the first and second top surfaces, Wherein a first angle between the first top surface and the sidewall surface of the floating gate structure is an obtuse angle; and
a word line and an erase gate over the substrate and on opposite outer sidewalls of the floating gate structure, a control gate structure over the first and second portions of the floating gate structure.

2. The flash memory cell structure of claim 1, further comprising:
a first dielectric sidewall structure between the word line and the floating gate structure; and
a second dielectric sidewall structure between the erase gate and floating gate structure.

3. The flash memory cell of claim 1, wherein the first top surface is above the second top surface.

4. The flash memory cell of claim 1, wherein the first and second top surfaces are separated from a bottom surface of the floating gate structure by different distances.

5. The flash memory cell of claim 1, wherein a total area of the first top surface, the second top surface, and the sidewall surface of the floating gate structure is greater than a total area of the bottom surface of the floating gate structure.

6. The flash memory cell of claim 1, wherein a second angle between the second top surface and the sidewall surface of the floating gate structure is an acute angle.

7. The flash memory cell of claim 1, wherein the control gate structure comprises a sidewall surface that has a similar shape as the sidewall surface of the floating gate structure.

8. The flash memory cell of claim 1, wherein the control gate structure comprises:
a third portion with a third thickness, wherein the third portion is formed over the first portion of the floating gate structure; and
a fourth portion with a fourth thickness that is different from the third thickness, wherein the fourth portion is formed over the second portion of the floating gate structure.

9. The flash memory cell of claim 8, wherein a sum of the first thickness of the first portion of the floating gate structure and the third thickness of the third portion of the control gate structure is the same as the sum of the second thickness of the second portion of the floating gate structure and the fourth thickness of the fourth portion of the control gate structure.

10. The flash memory cell of claim 9, wherein the third portion of the control gate structure has a third bottom surface, and the fourth portion of the control gate structure has a fourth bottom surface that is below the third bottom surface.

11. The flash memory cell structure of claim 10, further comprising:
a dielectric layer between the control gate structure and the floating gate structure, wherein the dielectric layer comprises:
a top dielectric surface in contact with the third bottom surface, the fourth bottom surface, and a sidewall surface of the control gate structure; and
a bottom dielectric surface opposite to the top dielectric surface, wherein the bottom dielectric surface is in contact with the first top surface, the second top surface, and the sidewall surface of the floating gate structure.

12. A flash memory structure, comprising:
a first floating gate structure, comprising:
a first portion with a first top surface and a first thickness; and
a second portion with a second top surface and a second thickness that is different from the first thickness, wherein the second portion comprises a first outer sidewall having a first outer sidewall thickness; and
a second floating gate structure, comprising:
a third portion with a third top surface and a third thickness; and
a fourth portion with a fourth top surface and a fourth thickness that is different from the third thickness, wherein the fourth portion comprises a second outer sidewall having a second outer sidewall thickness, wherein the first and second outer sidewall thicknesses are different.

13. The flash memory cell structure of claim 12, further comprising:
a first control gate structure over the first portion and the second portion of the first floating gate structure; and
a first sidewall of the first floating gate structure connecting the first top surface and the second top surface of the first floating gate structure, wherein a first angle between the first top surface and the first sidewall is an acute angle or an obtuse angle.

14. The flash memory cell structure of claim 13, further comprising:
a second control gate structure over the third portion and the fourth portion of the second floating gate structure; and
a second sidewall of the second floating gate connecting the third top surface and the fourth top surface of the second floating gate structure, wherein a second angle between the third top surface and the second sidewall is an acute angle or an obtuse angle.

15. The flash memory structure of claim 12, further comprising an erase gate formed between the first and second floating gate structures and in contact with the first and second outer sidewall s.

16. The flash memory structure of claim 12, wherein the first top surface is above the second top surface.

17. A method for forming flash memory cells, comprising:
depositing a floating gate material over a substrate;
etching the floating gate material with a masking layer to form first and second portions of the floating gate material, wherein the first portion comprises a first top surface and a first thickness and the second portion comprises a second top surface and a second thickness that is different from the first thickness;
depositing a dielectric layer on the first and second top surfaces and on a sidewall surface connecting the first and second top surfaces, wherein a first angle between the first top surface and the sidewall surface is an obtuse angle; and
forming a control gate structure over the dielectric layer.

18. The method of claim 17; further comprising forming an erase gate and a word line on opposite sidewalls of the second portion.

19. The method of claim 17, further comprising planarizing a top surface of the control gate structure.

20. The method of claim 17, wherein the first top surface is above the second top surface.

* * * * *